United States Patent
Reiss

(10) Patent No.: US 6,998,296 B2
(45) Date of Patent: Feb. 14, 2006

(54) ELECTRONIC COMPONENT AND METHOD FOR ITS PRODUCTION

(75) Inventor: Martin Reiss, Medingen (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/868,855

(22) Filed: Jun. 17, 2004

(65) Prior Publication Data
US 2004/0262780 A1 Dec. 30, 2004

Related U.S. Application Data

(63) Continuation of application No. PCT/DE02/04529, filed on Dec. 11, 2002.

(30) Foreign Application Priority Data
Dec. 20, 2001 (DE) .............................. 101 63 084

(51) Int. Cl.
H01L 21/44 (2006.01)
H01L 21/48 (2006.01)
H01L 21/50 (2006.01)

(52) U.S. Cl. ...................... 438/112; 438/124; 438/126; 438/127; 257/666; 257/787; 257/723

(58) Field of Classification Search ................ 438/112, 438/124, 126, 127; 257/666, 723, 787
See application file for complete search history.

(56) References Cited

U.S. PATENT DOCUMENTS

| 6,048,755 | A | 4/2000 | Jiang et al. | |
|---|---|---|---|---|
| 6,301,511 | B1 | 10/2001 | Fujita et al. | |
| 6,326,240 | B1 * | 12/2001 | Liaw | 438/113 |
| 2002/0168798 | A1 * | 11/2002 | Glenn et al. | 438/110 |
| 2002/0187591 | A1 * | 12/2002 | Bai | 438/126 |
| 2003/0108100 | A1 | 6/2003 | Sekiguchi et al. | |

FOREIGN PATENT DOCUMENTS

| EP | 0 644 507 B1 | 3/1995 |
|---|---|---|
| EP | 0 892 427 A2 | 1/1999 |
| JP | 58-182837 A2 | 10/1983 |
| JP | 09064077 A | 3/1997 |
| JP | 11040588 A | 2/1999 |
| JP | 11040591 A | 2/1999 |
| JP | 11067799 A | 3/1999 |
| WO | WO 03/054957 A2 | 7/2003 |

* cited by examiner

*Primary Examiner*—Nitin Parekh
(74) *Attorney, Agent, or Firm*—Edell, Shapiro & Finnan, LLC

(57) ABSTRACT

The invention relates to an electronic component and to a method for its production. The electronic component has a semiconductor chip and a wiring board, and a plastic package. The plastic package is divided into two plastic package molding compounds arranged one on top of the other. Of the plastic package molding compounds a first layeroof plastic package molding compound forms a relatively uneven surface, which is smoothed by a second layer of plastic package molding compound so that the electronic component has smooth outer sides of the plastic package.

14 Claims, 2 Drawing Sheets

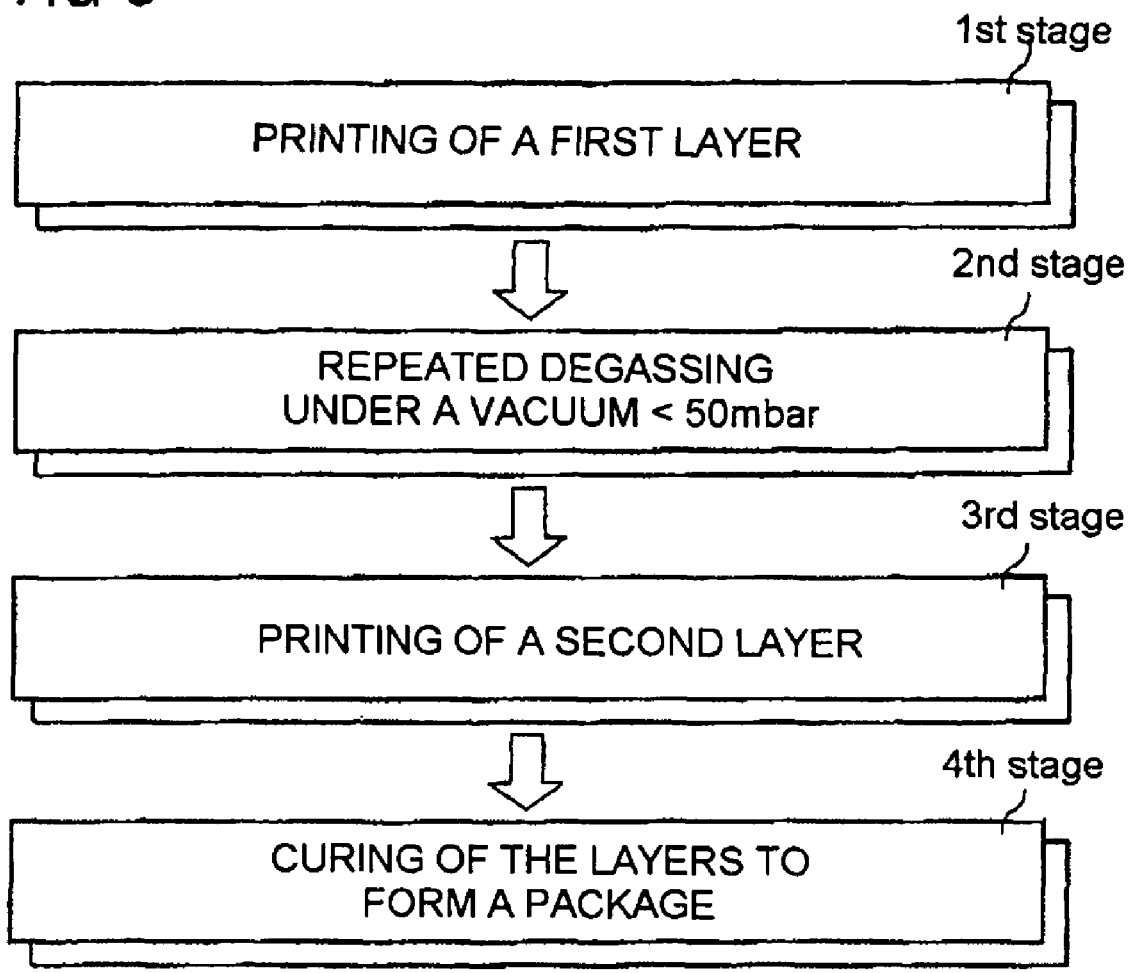

ELECTRONIC COMPONENT AND METHOD FOR ITS PRODUCTION

CROSS REFERENCE TO RELATED APPLICATIONS

This application is a continuation of PCT/DE02/04529, filed Dec. 11, 2002, and titled "Electronic Component and Method for its Production" which claims priority to German Application No. DE 101 63 084.0, filed on Dec. 20, 2001, and titled "Electronic Component and Method for its Production" the entire contents of which are hereby incorporated by reference.

FIELD OF THE INVENTION

The invention relates to an electronic component with a semiconductor chip and a wiring board with a plastic package and to a method for their production.

BACKGROUND

Electronic components with a semiconductor chip and a wiring board can be protected from damage by a plastic package molding compound, as known from the patent specification U.S. Pat. No. 6,048,755. The application of such a plastic package molding compound is performed, for example, by a high-pressure injection-molding process, in which the high pressure rules out the possibility of air bubbles being able to become lodged in the plastic package. If high pressure is not used, vacuum systems are required for printing the plastic package molding compound onto a lead frame, in which systems individual electronic components or a lead frame with a number of electronic components have a plastic package molding compound printed onto them. In this way, air inclusions are avoided in the case of vacuum printing, since the entire operation is carried out in a vacuum with the exclusion of air.

A vacuum printing system suitable for vacuum printing to enclose a semiconductor chip or a number of semiconductor chips in a plastic package molding compound is extremely costly and time-intensive, since the entire printing system has to be accommodated in a vacuum unit and the printing operation has to proceed in a vacuum chamber. In the case of a high-pressure pressing system for applying a plastic package, it is in turn necessary to produce mold parts which are resistant to high pressure and must in some cases withstand an injection molding pressure in excess of 150 bar, which likewise drives up costs.

SUMMARY

An electronic component and a method for its production in which semiconductor chips can be packaged with wiring boards in a plastic package molding compound without any bubbles is desirable.

According to the invention, the electronic component can have a plastic package, which can have two plastic package molding compounds arranged one on top of the other. One of these plastic package molding compounds can have a first layer, which can be uneven with respect to the outer sides of the plastic package. The first layer can enclose the marginal regions of the semiconductor chip and can partly cover the rear side of the semiconductor chip. In addition, the electronic component can have a second layer of plastic package molding compound, which can form smooth surfaces for the outer sides of the plastic package. This two-layered plastic package can be produced under normal clean-room conditions by a screen printing technique.

The first and second layers of a plastic package molding compound differ. After printing on the first layer, it can be subject to a degassing step, and can be relatively free of air bubbles. The degassing operation can result in an uneven surface of the first layer with respect to the outer sides of the plastic package, since the air bubbles that can be trapped when pressing occurs against sharp edges and into narrow gaps burst in the molten state. However, the unevenness of the surface of the first layer is not so great that a further degassing step is necessary when the second layer of a plastic package molding compound is printed onto the first layer. The printed-on even or smooth upper side provided by the second layer can be accepted as an outer side of the plastic package without any degassing. A high-pressure mold is no longer needed for injection molding and the plastic package molding compound can be applied to the rear sides of the semiconductor chips of a lead frame by a simple spatula. Instead of a complex processing system under a vacuum, the first layer of a plastic package molding compound can be kept in a degassing system.

Such a degassing system may include a vacuum chamber from which the air pressure can be pumped out, which can take place for many components simultaneously and for a number of substrate supports with a number of components simultaneously. In this respect, the first layer of plastic package molding compound can be degassed with a simple pre-vacuum pressure of less than 50 mbar, so that the frequency and size of air bubbles in the first layer of plastic can be reduced in spite of the relatively steep edges at the margins of the individual semiconductor chips and in spite of in the gap between the semiconductor chips of a lead frame.

The first layer of the plastic package molding compound can have an uneven surface with respect to the outer sides of the electronic component as a result of the degassing; this unevenness can be evened out by the second layer of plastic package molding compound, so that an uneven boundary phase between the two plastic package molding compounds within the plastic package can occur, but it is not externally evident. This uneven boundary phase consequently does not change the pleasing appearance of the electronic component and can be detected in the plastic package molding compound from corresponding sectional images.

The first layer and the second layer can be interlocked with each other by the uneven outer surface of the first layer, which can form an uneven boundary phase between the layers. This interlocking may take place by the degassing of the first layer being followed by application of the second layer to the not yet crosslinked and cured first layer. In this way it is possible at the same time for the crosslinking to take place beyond the boundary phase and consequently for intensive anchorage of the two layers to be possible.

The electronic component can have a bonding channel opening in the wiring board. This bonding channel opening can be filled with a plastic covering compound to protect bonding connections. This plastic covering compound may also be applied by screen printing, which, however, can be carried out separately from the production of the package on the underside of the electronic component, since the bonding channels can be arranged in the wiring board on the side that is opposite from the plastic package, i.e., the active upper side 27 of the semiconductor chip.

For the production of a number of components according to the invention, a method for coating a lead frame for a number of semiconductor chips can be carried out in corresponding component positions. For this purpose, the semiconductor chips can be attached on the lead frame by double-sided adhesive film and the bonding connections have already been established in the bonding channel of each component position. Furthermore, the bonding channel can already be protected by a plastic covering. Consequently, the entire lead frame with a number of semiconductor chips can subsequently be covered with a plastic package molding compound on the rear sides of the semiconductor chips and the intermediate spaces between the semiconductor chips can thereby be filled at the same time as edge protection. For this purpose, a first layer of viscous plastic package molding compound can be printed on the lead frame for filling intermediate spaces between the semiconductor chips and for partly covering the rear sides of the semiconductor chips with the plastic package molding compound. After this application by printing, a degassing process can be carried out, in that the lead frame with the first layer of plastic package molding compound can be kept in a vacuum chamber with the air being pumped out of the vacuum chamber.

After degassing the plastic package molding compound so there are no air bubbles in the corners between the individual chips, a second layer of viscous plastic package molding compound can be printed onto the first layer of plastic package molding compound. Although the upper side of the first layer thereby forms a relatively uneven outer surface 12, the second layer can be applied to the rear sides of the semiconductor chips without air bubble inclusions and without degassing.

In an example of how the method is implemented, the printing on of the first and second layers of viscous plastic package molding compound can be carried out by a screen printing technique. In the screen printing technique, a screen can be placed over the lead frame and a bead of viscous plastic package molding compound can be pressed with a spatula over the openings in the screen. For this purpose, when brushing over or doctoring the screen, the spatula cam be subject to a pressure, which neither corresponds to the high pressure during injection molding or is comparable with the latter with respect to the loading of the lead frame.

The admission and pumping away of air may take place several times in succession during the keeping of the first layer in the vacuum chamber before the second layer of plastic package molding compound can be applied by printing outside the vacuum chamber. Any number of prepared lead frames with first layers of a plastic package molding compound can be kept inside the vacuum chamber, and consequently, several electronic components with a first layer, freed of air bubbles, can be degassed. By repeated admission of air to the system, the degassed air can be repeatedly purged and pumped away.

In another example of how the method is implemented, the second layer of plastic package molding compound can be applied with the same printing screen as the first layer of plastic package molding compound. Consequently, the outlay on screens can be relatively low and can ensure the reuse of screens for further lead frames for applying plastic package molding compound to a number of electronic components.

With the electronic component and the method of producing are a vacuum printer is not necessary to obtain a plastic package molding compound without air bubbles on the electronic component. Furthermore, by contrast with vacuum printing, the time in which the vacuum is built up and let down is not included in the process time, i.e., the production time for units per hour is less in the case of the component and method according to the invention than in the case of the vacuum printer, for example, by almost 50%.

Consequently, the combination of a normal screen printing process with a vacuum degassing operation and the subsequent overprinting of the rather uneven surface of the first layer of plastic package molding compound can provide a relatively even outer side for the package and can ensure good interlocking if the curing phase starts after the application of the second layer.

BRIEF DESCRIPTION OF THE FIGURES

The invention is now explained in more detail on the basis of embodiments with reference to the accompanying drawings.

FIG. 3 shows a flow diagram in four stages of a method for producing a plastic package for the electronic component.

DETAILED DESCRIPTION

Figure 1:
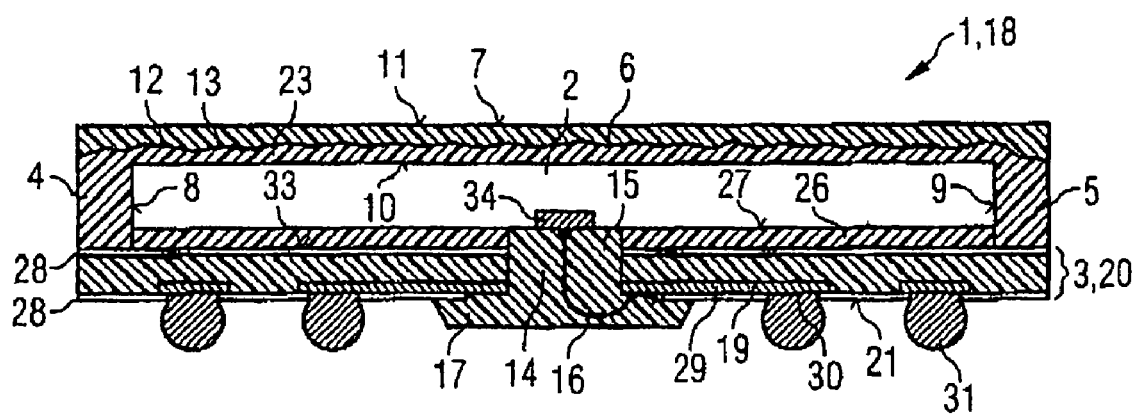
FIG. 1 shows a schematic cross section through an electronic component of a first embodiment of the invention.

FIG. 1 shows a schematic cross section through an electronic component 1 of an embodiment of the invention. The reference numeral 2 identifies the semiconductor chip. The reference numeral 3 identifies a wiring board, which can be connected by its upper side 33 to the active upper side 27 of the semiconductor chip 2 by a double-sided adhesive film 26. The reference numeral 4 identifies a plastic package, which can be arranged on the upper side 33 of the wiring board three and can enclose a rear side 10 and marginal regions 8 and 9 of the semiconductor chip 2. The wiring board 3 can have a multi-layered construction and can have a solder resist layer 28 on its underside, which can protect a patterned metal layer 29 with wiring interposers 19. The solder resist layer on the underside of the wiring board 3 can leave outer contact areas 30, on which solder balls 31 can be arranged, free of the coating. The wiring board 3 shown in FIG. 1 of an individual electronic component 1 is part of a lead frame 20 for a number of electronic components 1, which for its part can have a component position for each electronic component 1.

The solder resist layer of the underside 21 of the lead frame 20 and the patterned metal layer 29 can be arranged on an insulating core plate 32 of the wiring board 3 or the lead frame 20. For reasons of symmetry, this core plate can have a solder resist layer 28 on its upper side, opposite from the metal layer. This can even out and compensate for the effect of the different coefficients of expansion between the solder resist layer 28 on the underside and the core plate 32 and the core plate 32 itself. Consequently, the wiring board 3 or the lead frame 20 can form a laminate of four layers. The symmetrical construction of a lead frame can prevent it from being warped when it is supplied or can prevent subsequent process steps from causing warpage effects which result in electronic components 1 that are unusable and unoperational.

In this embodiment of the invention, the electronic component 1 can have rows of solder balls 31. Arranged at the center of the wiring board 3 can be a bonding channel opening 14, which can expose a bonding channel 15 for providing bonding connections 16 between contact areas 34 on the upper side 27 of the semiconductor chip and the wiring interposers 19 on the underside of the wiring board 3.

Before printing a plastic package molding compound 4 onto the rear sides 10 of the semiconductor chips 2, the sensitive bonding connections 16 on the underside of the wiring board 3 and the upper side 27 of the semiconductor chip 2 can be protected by filling with a plastic covering compound 17. For this purpose, the wiring board 3 can be connected to a larger lead frame 20 with a number of components 1. This lead frame 20 can have a number of component positions 18, in which a bonding channel 15 and a semiconductor chip 2 can be, respectively, arranged. The bonding channels 15 of the lead frame 20 can be printed with a plastic covering compound 17 simultaneously and in parallel after the bonding connections 16 for the electronic components 1 have been established.

After covering the bonding channels 15 on the underside 21 of the lead frame 20, the upper side of the lead frame 20 and the rear sides 10 of the semiconductor chips 2 can be printed with a plastic package molding compound 23. If this printing is to be carried out without any bubbles, or with few air bubbles, vacuum printers or vacuum printing systems can be used. In the case of the present embodiment of the invention, however, the upper side of the lead frame 20 with the semiconductor chips 2 located on it can be printed with a plastic package molding compound 23 by arranging a screen over the lead frame 20 and a viscous bead of plastic package molding compound 23 can be distributed with a spatula over the lead frame 20 and over the rear sides 10 of the semiconductor chips 2. This operation cannot take place without bubbles on account of the high viscosity of the plastic package molding compound 23 required during application.

According to the invention, the lead frame 20, and consequently also the components 1, can be printed with a plastic package molding compound 23 in two steps. In the first step, a first layer 5 can be applied. The first layer cannot be printed on completely without bubbles on account of the steep portions between the semiconductor chips 2. This first layer 5, which fills the intermediate spaces but not without any bubbles and partly covers the marginal sides 8 and 9 and the rear sides of the semiconductor chips 2, can be degassed after being printed on, i.e., before the first layer 5 is subject to a curing operation.

For degassing, the lead frame 20 may be stacked in a vacuum chamber with other lead frames and the plastic package molding compound 23 of the first layer 5 degassed by repeated admission of air to the vacuum chamber and pumping away of the air, and consequently air bubbles can be extracted from the plastic package molding compound 23. This produces a relatively uneven boundary phase on the first layer 5 of the plastic package molding compound 23. This is identified in FIG. 1 by the reference numeral 13. After the degassing, a second layer 6 can be printed onto this uneven boundary phase 13 and this multi-stage method allows the effect to be achieved that a plastic package molding compound 23 that has few air bubbles can then surrounds the semiconductor chips 2 on their rear sides 10 with a smooth upper side 11.

After the multi-stage printing of the lead frame 20 on the semiconductor chip side, solder balls can be arranged on the side of the metal coating 29 and the solder resist layer 28 can melt, then forming the external contacts for the electronic component 1. After the electronic components 1 in every component position 18 have been produced, the lead frame 20 can be divided into individual electronic components 1, as shown in the cross section of FIG. 1.

Figure 2:
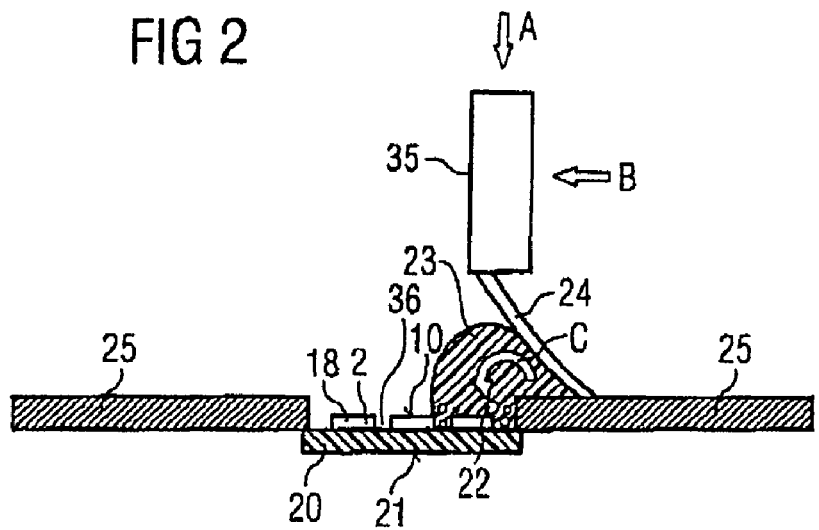
FIG. 2 shows a basic diagram of a device for printing a viscous plastic package molding compound between and onto a number of semiconductor chips of a lead frame.

FIG. 2 shows a basic diagram of a device for printing a viscous plastic package molding compound 23 on and between a number of semiconductor chips 2 of a lead frame 20. Components with the same functions as in FIG. 1 are discussed with the same reference numerals and not separately.

When printing on the rear sides of the semiconductor chips on the lead frame 20, the spatula 24 can initially be pressed onto the screen 25 with a pressing force in direction A. For this purpose, the screen can be held by the holder 35 and can be moved in direction B, after which a bead of plastic package molding compound 23 can be built up in front of the spatula 24. When the spatula 24 is moved in direction B, a rotating roll of viscous plastic package molding compound 23 can form, rotating in the direction of arrow C. This covers the rear sides 10 and the intermediate spaces 36 between the semiconductor chips 2. In particular, air bubble inclusions 22 can be obtained in the intermediate spaces 36.

The air bubble inclusions 22 can be expelled from the first layer of plastic package molding compound 23 by a degassing step. For this purpose, after applying the plastic package molding compound 23 to the rear sides 10 of the semiconductor chips 2 and introducing the plastic package molding compound 23 into the intermediate spaces 36 between the semiconductor chips 2, the lead frame 20 can be lifted off the screen 25 and can be brought into a vacuum chamber.

In the vacuum chamber, the expulsion of air bubble inclusions 22 can take place, with an uneven surface forming. This uneven surface can be smoothed by the lead frame 20 being printed a further time with a plastic package molding compound 23, as shown in FIG. 2. For this purpose, the same screen 25 as for printing the first layer, can be used. This can produce an even second layer of plastic package molding compound 23, which has no air bubble inclusions 22 because the critical intermediate spaces 36 are already filled with plastic package molding compound 23 when the first layer is being formed.

FIG. 3 shows a flow diagram in four stages of a method for producing a plastic package for the electronic components.

In stage 1, as shown in FIG. 2, the plastic package molding compound can be printed onto the rear sides and into the intermediate spaces of the semiconductor chips of a lead frame. In the second stage, the air bubble inclusions produced in the first stage can be degassed in a vacuum chamber under a pressure which is less than 50 mbars. After this degassing, the surface of the first layer of plastic package molding compound can have an uneven surface with respect to the outer sides 7 of the future package.

This uneven surface is, however, sufficiently free of imperfections to carry out a further smoothing printing on the lead frame without the formation of air inclusions in a second printing step in the third stage. In the process, a boundary phase can be formed between the first layer and the second layer, identified in FIG. 1 by the reference numeral 13. Up until this step, no curing of the viscous plastic package molding compound has taken place. The high viscosity is required for the plastic package molding compound in order for it to remain dimensionally stable during and after the printing and not to be displaced or for indentations or other unevennesses to form on the outer side 7 of the package.

In the fourth stage of FIG. 3, the curing can begin or the curing can be carried out at an elevated temperature. During the curing, the plastic package molding compound of the first and second layers can crosslink to form a plastic package. Once the curing stage, which is identified in FIG. 3 as stage 4, has been carried out, solder balls can be arranged on the underside of the lead frame as external contacts and can be soldered in. After that, the lead frame can be divided up into individual electronic components according to the present invention.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

I claim:

1. A method for coating a a plurality of semiconductor chips mounted on a lead frame with a plastic package molding compound, the method comprising:

printing a first layer of viscous plastic package molding compound on the lead frame to fill intermediate spaces between the semiconductor chips and to coat surfaces of the semiconductor chips with the plastic package molding compound;

placing the lead frame with the first layer of plastic package molding compound in a vacuum chamber with reduced air pressure; and printing a second layer of viscous plastic package molding compound onto the first layer of plastic package molding compound.

2. The method as claimed in claim 1, wherein the printing of the first and second layers of viscous plastic package molding compound takes place by screen printing.

3. The method as claimed in claim 1, wherein, when printing the first and second layers of viscous plastic package molding compound a spatula is pressed under pressure onto a printing screen.

4. The method as claimed in claim 1, wherein the air pressure is repeatedly decreased and increased in the vacuum chamber to degas the first layer prior to applying the second layer of plastic package molding compound.

5. The method as claimed in claim 1, wherein the second layer of plastic package molding compound is applied with the same printing screen as the first layer of plastic package molding compound.

6. The method as claimed in claim 1, wherein the printing of the first layer of plastic package molding compound is performed under normal cleanroom conditions.

7. The method as claimed in claim 6, wherein the printing of the second layer of plastic package molding compound is performed under normal cleanroom conditions.

8. The method as claimed in claim 1, wherein the lead frame is stacked in the vacuum chamber.

9. The method as claimed in claim 1, wherein the printing of the first layer of plastic package molding compound is performed without use of a vacuum chamber.

10. The method as claimed in claim 1, wherein the printing of the second layer of plastic package molding compound is performed without use of a vacuum chamber.

11. The method as claimed in claim 1, wherein, upon printing the first layer of plastic package molding compound, air bubbles are present in the first layer of plastic package molding compound.

12. The method as claimed in claim 11, wherein placing the lead frame in the vacuum chamber with reduced air pressure degasses the first layer of plastic package molding compound.

13. The method as claimed in claim 1, wherein, subsequent to printing the second layer, the first and second layers are cured to form crosslinks between the first and second layers.

14. The method as claimed in claim 1, further comprising:

connecting electronic circuits of the semiconductor chips to wiring interposers of the lead frame via bonding connections.

* * * * *